(12) United States Patent
Hatakeyama et al.

(10) Patent No.: US 11,586,169 B2
(45) Date of Patent: Feb. 21, 2023

(54) PRODUCTION MANAGEMENT DEVICE

(71) Applicant: Yamaha Hatsudoki Kabushiki Kaisha, Iwata (JP)

(72) Inventors: Takuji Hatakeyama, Iwata (JP); Yoshiki Okumura, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 537 days.

(21) Appl. No.: 16/613,097

(22) PCT Filed: May 18, 2017

(86) PCT No.: PCT/JP2017/018637
§ 371 (c)(1),
(2) Date: Nov. 12, 2019

(87) PCT Pub. No.: WO2018/211649
PCT Pub. Date: Nov. 22, 2018

(65) Prior Publication Data
US 2020/0333760 A1 Oct. 22, 2020

(51) Int. Cl.
*G05B 19/18* (2006.01)
*H05K 13/08* (2006.01)
*H05K 13/02* (2006.01)

(52) U.S. Cl.
CPC ........... *G05B 19/188* (2013.01); *H05K 13/02* (2013.01); *H05K 13/085* (2018.08); *G05B 2219/45026* (2013.01)

(58) Field of Classification Search
None
See application file for complete search history.

(56) References Cited

U.S. PATENT DOCUMENTS

2009/0062951 A1 3/2009 Awata

FOREIGN PATENT DOCUMENTS

| JP | 2007-043085 A | 2/2007 |
| JP | 2009-071137 A | 4/2009 |

(Continued)

OTHER PUBLICATIONS

Jia et al., "Semiconductor manufacturing scheduling of jobs containing multiple orders on identical parallel machines", International Journal of Production Research, 2009 Taylor & Francis (Year: 2009).*

(Continued)

*Primary Examiner* — Carlos R Ortiz Rodriguez
(74) *Attorney, Agent, or Firm* — Studebaker & Brackett PC

(57) ABSTRACT

A production management device, such as a production management computer, determines a production sequence of plural types of substrates in order to produce the substrates consecutively on a product type-by-type basis by using a component mounter including component supply devices. The production management device includes a main control unit for determining a production sequence of substrates such that, where a time from start to completion of off-line setup of all the component supply devices to be used for a single product type of substrate is defined as an off-line setup time, a sum of the off-line setup times for two product types of substrates to be consecutively produced is balanced over an entire period of consecutive production.

3 Claims, 8 Drawing Sheets

(56) References Cited

FOREIGN PATENT DOCUMENTS

| JP | 2013-191677 A | 9/2013 |
| JP | 2014-056901 A | 3/2014 |
| JP | 2015-146118 A | 8/2015 |

OTHER PUBLICATIONS

An Office Action issued by the State Intellectual Property Office of the People's Republic of China dated Jun. 17, 2020, which corresponds to Chinese Patent Application No. CN 201780089898.6.
International Search Report issued in PCT/JP2017/018637; dated Aug. 15, 2017.
An Office Action; "Notice of Reasons for Refusal," mailed by the Japanese Patent Office dated Sep. 3, 2020, which corresponds to Japanese Patent Application No. 2019-518688 and is related to U.S. Appl. No. 16/613,097; with English language translation.

* cited by examiner

FIG.6

| COMPONENT TYPE | FEEDER TYPE | FEEDER WIDTH |
|---|---|---|
| COMPONENT B1 | FEEDER F1 | W1 |
| COMPONENT B2 | FEEDER F2 | W2 |
| COMPONENT B3 | FEEDER F3 | W3 |
| COMPONENT B4 | FEEDER F4 | W4 |
| COMPONENT B5 | FEEDER F5 | W5 |
| COMPONENT B6 | FEEDER F6 | W6 |
| COMPONENT B7 | FEEDER F7 | W7 |
| COMPONENT B8 | FEEDER F8 | W8 |
| COMPONENT B9 | FEEDER F9 | W9 |
| COMPONENT B10 | FEEDER F10 | W10 |
| COMPONENT B11 | FEEDER F11 | W11 |
| COMPONENT B12 | FEEDER F12 | W12 |
| COMPONENT B13 | FEEDER F13 | W13 |
| COMPONENT B14 | FEEDER F14 | W14 |
| COMPONENT B15 | FEEDER F15 | W15 |
|  |  |  |
|  |  |  |
|  |  |  |
|  |  |  |

FIG. 8A

| PRODUCT TYPE OF SUBSTRATE | NUMBER OF NECESSARY CARTS | | | |
|---|---|---|---|---|
| A | 8 | OFF-LINE SETUP TIME | 30 MIN | IN GENERAL, OFF-LINE SETUP IS CARRIED OUT ON PREVIOUS DAY |
| | | MACHINE OPERATING TIME | 30 MIN | |
| B | 7 | OFF-LINE SETUP TIME | 50 MIN | |
| | | MACHINE OPERATING TIME | 30 MIN | |
| C | 3 | OFF-LINE SETUP TIME | 10 MIN | |
| | | MACHINE OPERATING TIME | 30 MIN | |
| D | 4 | OFF-LINE SETUP TIME | 10 MIN | |
| | | MACHINE OPERATING TIME | 30 MIN | |

FIG. 8B

| PRODUCT TYPE OF SUBSTRATE | NUMBER OF NECESSARY CARTS | | | |
|---|---|---|---|---|
| A | 8 | OFF-LINE SETUP TIME | 30 MIN | IN GENERAL, OFF-LINE SETUP IS CARRIED OUT ON PREVIOUS DAY |
| | | MACHINE OPERATING TIME | 30 MIN | |
| C | 3 | OFF-LINE SETUP TIME | 10 MIN | |
| | | MACHINE OPERATING TIME | 30 MIN | |
| B | 7 | OFF-LINE SETUP TIME | 50 MIN | |
| | | MACHINE OPERATING TIME | 30 MIN | |
| D | 4 | OFF-LINE SETUP TIME | 10 MIN | |
| | | MACHINE OPERATING TIME | 30 MIN | |

PRODUCTION MANAGEMENT DEVICE

CROSS-REFERENCE TO RELATED APPLICATION

This application is a National Stage of International Patent Application No. PCT/JP2017/018637, filed May 18, 2017, the entire content of which is incorporated herein by reference.

BACKGROUND

Technical Field

The technique disclosed in the present specification relates to a production management device.

Background Art

A production support system described in Japanese Unexamined Patent Application Publication No. 2013-191677 has been conventionally known as improving the production efficiency in producing plural types of products on a printed circuit board production line. This production support system includes a grouping unit that groups plural types of products within a range of the maximum number of types of components to be attached by a mounter, and a scheduling unit that determines a production sequence of the groups based on the component installation time for each group. This scheduling unit determines the production sequence of the groups by alternately arraying a group that requires the longest component installation time and a group that requires the shortest component installation time among the groups so as to balance the total component installation time required for groups adjacent to each other in the production sequence over the entire production period.

SUMMARY

According to the production support system described above, the total component installation time required for groups adjacent to each other in the production sequence can be balanced. However, this does not reduce the operation stop time from completion of installation of the ongoing group to start of installation of the subsequent group. The reason for this is because the component installation time is not always proportional to the off-line setup time required for off-line setup for the component installation.

For example, assuming that there are two groups that require equal component installation time, if the number of carts to be used for one of the groups is smaller than the number of carts to be used for the other group, the off-line setup time for the one group becomes shorter than the off-line setup time for the other group. Thus, compared to the one group, operation stop is more likely to occur in the other group.

As described above, in order to reduce the operation stop time between the groups, it is necessary to take into account the off-line setup time for each group. It is thought to be insufficient to solely balance the total component installation time required for groups adjacent to each other in the production sequence.

A production management device disclosed in the present specification is a production management device that determines a production sequence of plural types of substrates in order to produce the substrates consecutively on a product type-by-type basis by using a component mounter including component supply devices. The production management device includes a determination means for determining a production sequence of substrates such that, where a time from start to completion of off-line setup of all the component supply devices to be used for a single product type of substrate is defined as an off-line setup time, a sum of the off-line setup times for two product types of substrates to be consecutively produced is balanced over an entire period of consecutive production.

Assuming that product types of substrates to be consecutively produced are represented as A, B, C, and D, the off-line setup time is set to 50 minutes for B, 10 minutes for C, and 10 minutes for D, respectively, and A, B, C, and D are produced in the described order, because in general, off-line setup for A is carried out on the previous day, off-line setup for B is started simultaneously with production start of A. In this case, the off-line setup time for B is longest among B to D. Thus, unless off-line setup for B is completed before completion of the production of A, this causes machine operation stop due to a wait for the off-line setup work for B.

Accordingly, B and C are interchanged in the production sequence for example, and this leads to the entire production sequence, that is, A, C, B, and D. This results in the sum of the off-line setup times for C and B being 60 minutes, and the sum of the off-line setup times for B and D also being 60 minutes. The sum of the off-line setup times is therefore balanced over the entire period of consecutive production. In this manner, off-line setup for C is started simultaneously with production start of A. The off-line setup time for C is shorter than the off-line setup time for B. This facilitates completion of the off-line setup for B before completion of the production of A, and can prevent the machine operation stop. Further, after completion of the off-line setup for C, off-line setup for B can also be carried out up until production of C is completed.

According to the above configuration, the sum of the off-line setup times for two product types of substrates to be consecutively produced is balanced over the entire period of consecutive production. This can reduce machine operation stop caused by a wait for the off-line setup work.

The production management device disclosed in the present specification may be configured as described below.

The determination means may determine a production sequence of substrates such that, when a time from start to completion of production of a single product type of substrate is defined as a machine operating time, and when the machine operating time is constant for two product types of substrates to be consecutively produced, a substrate of a product type for which the off-line setup time is longer and a substrate of a product type for which the off-line setup time is shorter are alternately arrayed.

According to this configuration, in a case where the machine operating time is constant, while the off-line setup time is different between two product types of substrates to be consecutively produced, the sum of the off-line setup times can be balanced by alternately arraying these two product types of substrates.

The component supply devices may be arranged side by side on a single attachment plate, and it may be possible to attach the attachment plates to the component mounter. The determination means may determine a production sequence of substrates such that a substrate of a product type with a larger number of the attachment plates needed simultaneously, and a substrate of a product type with a smaller number of the attachment plates needed simultaneously are alternately arrayed.

In order to carry out off-line setup, at least a total number of attachment plates to be used for two product types of substrates to be consecutively produced are needed. According to the configuration described above, a substrate of a product type with a larger number of necessary attachment plates and a substrate of a product type with a smaller number of necessary attachment plates are alternately arrayed. This can minimize the number of attachment plates to be used simultaneously.

In a case where the off-line setup time for each substrate is approximately proportional to the number of attachment plates used, the sum of the off-line setup times for two product types of substrates to be consecutively produced can also be balanced.

The technique disclosed in the present specification can prevent machine operation stop caused by a wait for off-line setup work.

BRIEF DESCRIPTION OF THE DRAWINGS

FIG. 6 is a diagram showing details stored in a storage unit;

FIGS. 8A and 8B are diagrams showing a procedure for determining a production sequence of substrates.

DETAILED DESCRIPTION

Embodiment

An embodiment of the present disclosure is described below with reference to FIGS. 1 to 8.

1. Overall Configuration of Substrate Production Line L

Figure 1:
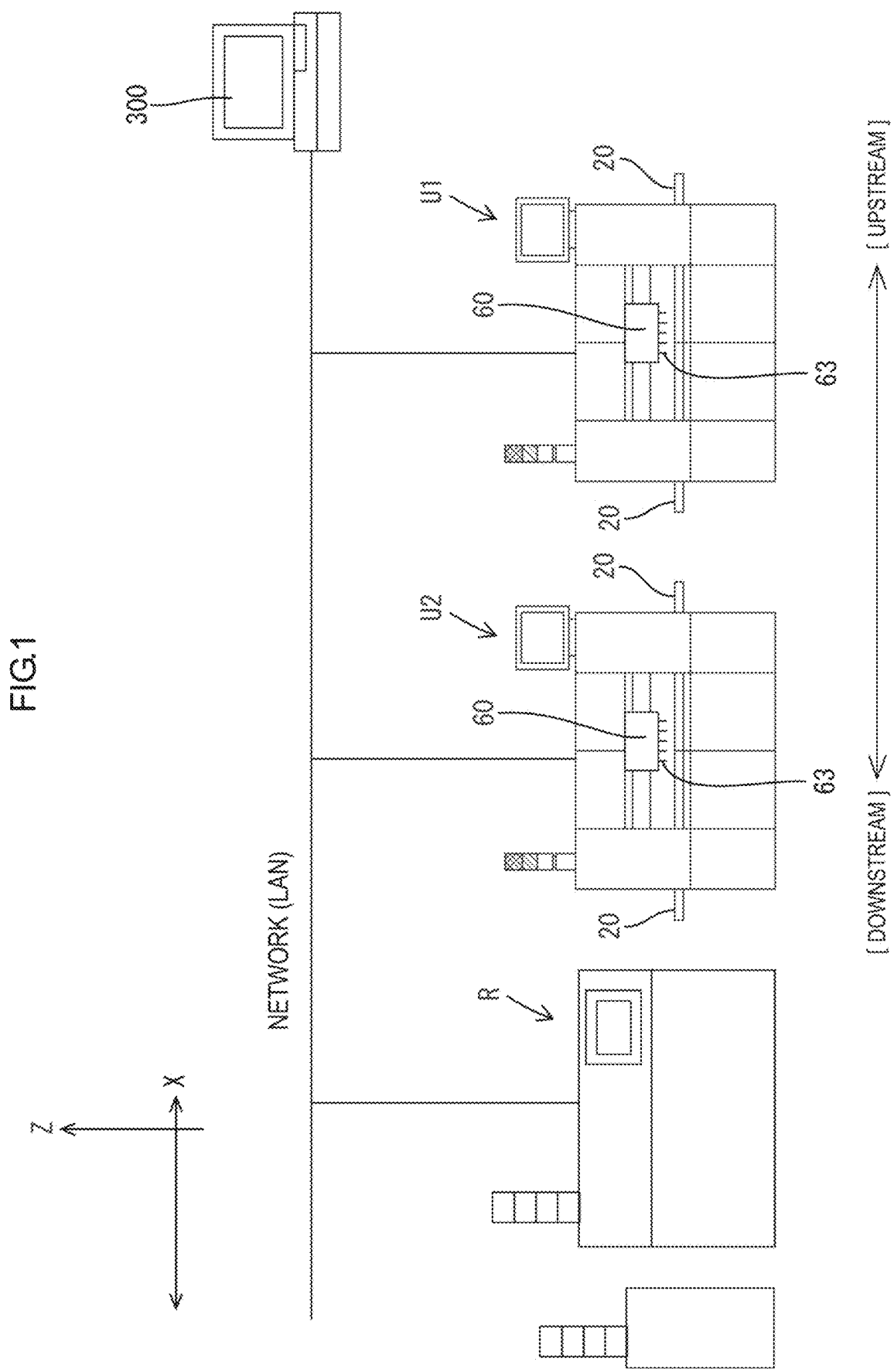
FIG. 1 is a diagram showing a line configuration of a substrate production line according to an embodiment of the present disclosure.

FIG. 1 is a diagram showing a part of the configuration of a substrate production line L applied to the present embodiment. This substrate production line L connects a solder printing device (not shown), surface mounters U1 and U2, and a reflow device R in series by a conveyor. The substrate production line L produces a substrate by performing predetermined processes on the substrate, such as a printing process (a process of performing screen printing of solder paste on the substrate surface), a component mounting process (a process of mounting chip components such as an IC on the substrate after having undergone the printing process), and a reflowing process (a process of dissolving the solder paste under high temperature to electrically connect the chip components and a pattern on the substrate), respectively by these devices U1, U2, and R.

In FIG. 1, a production management computer that manages the substrate production line L is denoted by a reference numeral 300. In the present embodiment, the devices U1, U2, and R, making up the substrate production line L, are electrically connected with the production management computer 300 through a local area network (LAN). The production management computer 300 is configured to manage the operational state of the devices U1, U2, and R.

2. Configuration of Surface Mounters U1 and U2

As shown in FIG. 1, each of the surface mounters U1 and U2 includes a substrate transport conveyor 20, a component supply unit 30, and a head unit 60. In the descriptions below, a substrate transport direction (the lateral direction in FIGS. 1 and 2) is defined as an X-axis direction, while a Y-axis direction and a Z-axis direction are defined as shown in FIGS. 1 and 2.

Figure 2:
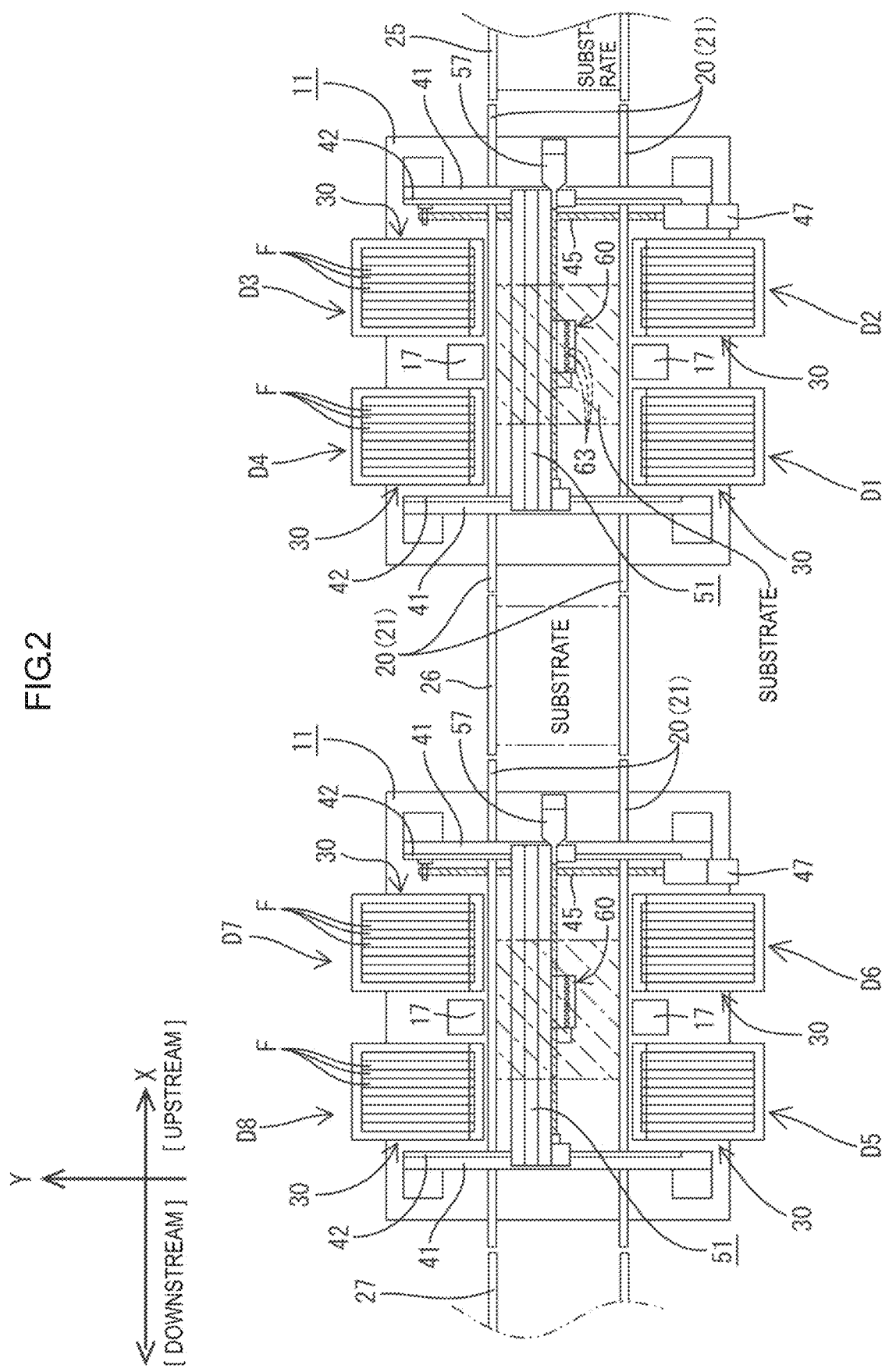
FIG. 2 is a plan view of a surface mounter.

As shown in FIG. 2, the transfer conveyor 20 includes a pair of transfer belts 21 that are driven to circulate in the X direction, such that the transfer conveyor 20 is configured to deliver a substrate placed on the upper surface of the belts 21 in the X-axis direction by friction between the substrate and the belts 21.

On the upstream side of the mounter U1, a transfer conveyor 25 is installed. On the downstream side of the mounter U2, a transfer conveyor 27 is installed. Further, between the mounters U1 and U2, a transfer conveyor 26 is installed.

These transfer conveyors 25 to 27 continue steplessly to the transfer conveyors 20 provided in the mounters U1 and U2, and have a function of relaying a substrate between adjacent devices.

With this configuration, a substrate can be delivered from the solder printing device positioned on the upstream side sequentially (the solder printing device the mounter U1 the mounter U2 the reflow device R).

A substrate delivered onto a base table 11 of the mounter U1 through the transfer conveyor 25, and a substrate delivered onto the base table 11 of the mounter U2 through the transfer conveyor 26 are respectively stopped by a substrate stopper (not shown) at a work position (the position shown by the dot-and-dash line in FIG. 2) at the center of the base tables 11.

The component supply units 30 are provided respectively at four corners on the base table 11 of each of the mounters U1 and U2. These component supply units 30 serve as a supply location of components to be mounted, at each of which a batch exchange cart is removably attached. That is, in the present embodiment, four batch exchange carts D1 to D4 in total are attached to the surface mounter U1, and four batch exchange carts D5 to D8 in total are attached to the surface mounter U2. A maximum of eight batch exchange carts can be used in total in both the surface mounters U1 and U2.

Figure 3:
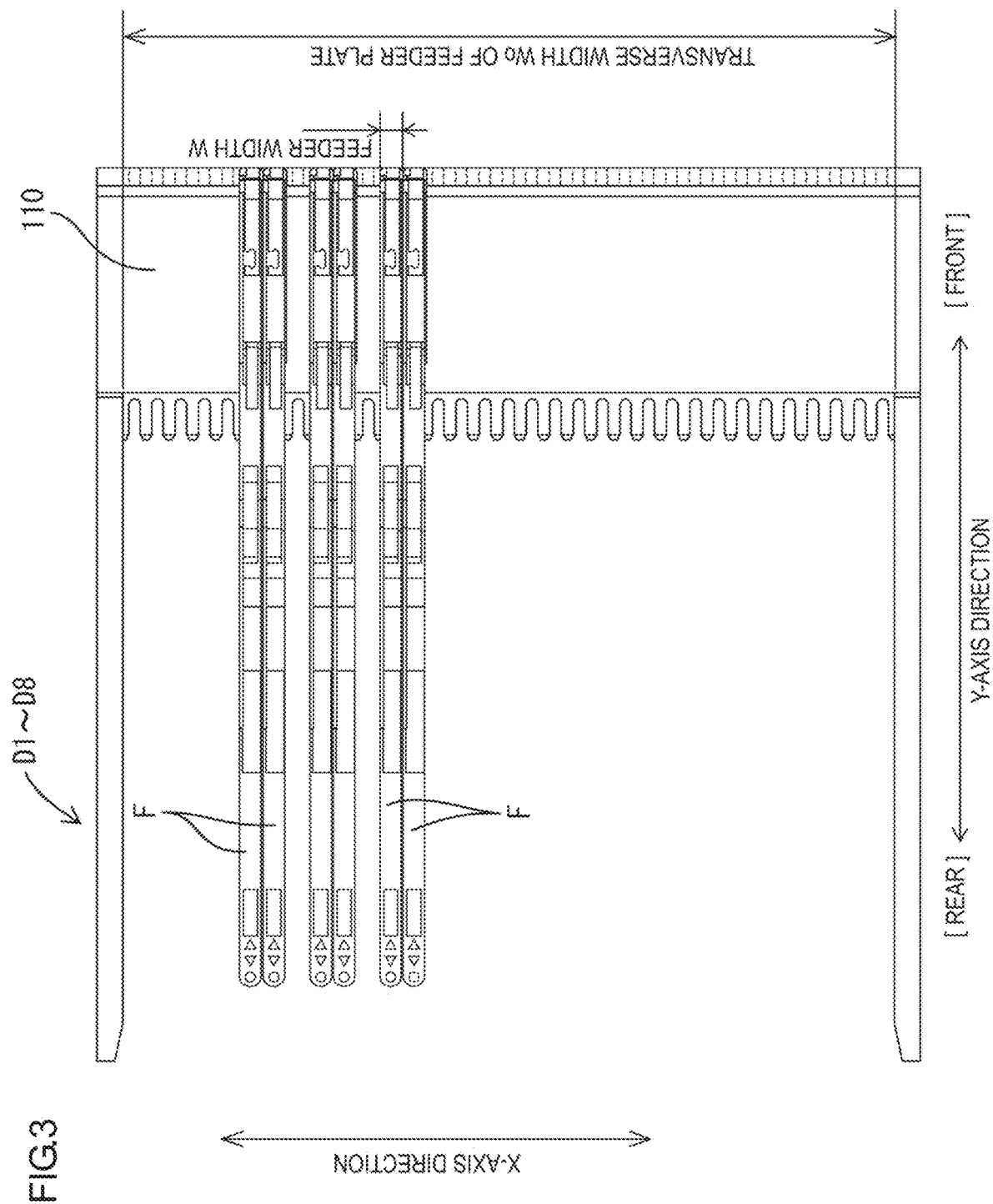
FIG. 3 is a plan view of a batch exchange cart (only showing a feeder plate and the periphery of the feeder plate)

Each of the batch exchange carts D1 to D8 (hereinafter, simply referred to as "cart") includes a feeder plate 110 (an example of the "attachment plate" of the present disclosure) having a flat shape at the front part of the cart as shown in FIG. 3. The feeder plate 110 is formed into a shape extending vertically in FIG. 3 (in the relationship with the surface mounters U1 and U2, the X-axis direction along the transport direction of the conveyors 20). The feeder plate 110 is configured to install feeders F thereon side by side.

Figure 4:
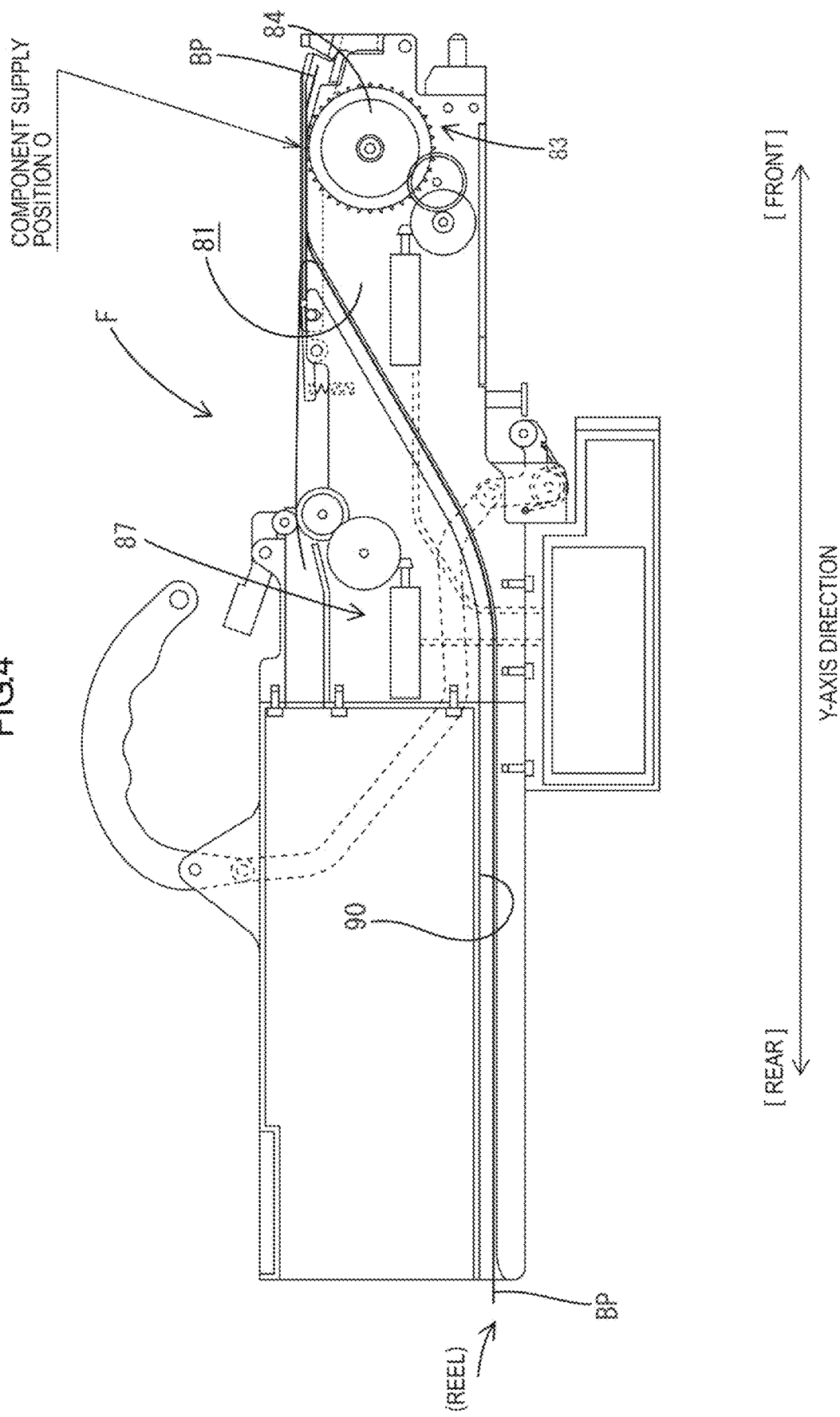
FIG. 4 is a side view of a feeder.

The feeder F is made up principally of a feeding device 83, a tensioning device 87, a feeder body 81 to which the feeding device 83 and the tensioning device 87 are fixed, and other devices. The feeder F is formed in its entirety into a shape elongated in the Y-axis direction as shown in FIG. 4.

At the rear part of the feeder body 81, a component supply tape BP in the form of a sheet, holding components on the upper surface of the component supply tape BP at regular intervals, is wound around, and held by, a reel (not shown). The feeder body 81 is provided with a tape passage 90. The component supply tape BP unreeled from the reel passes through the tape passage 90 and is pulled out forward relative to the feeder F.

With the above configuration, when the feeding device 83 is actuated, a sprocket 84 constituting the feeding device 83 rotates to pull the component supply tape BP within the tape passage 90 forward, and consequently to supply the components to a component supply position O set at the front end of the feeder F at regular intervals. A single feeder F can only supply a single type of component. Thus, substrate production needs at least the feeders F according to the number of types of components to be mounted.

Next, referring back to FIGS. 2 and 3, descriptions are given of the head unit 60 and a servo mechanism that drives the head unit 60. The head unit 60 mounts components supplied through the feeder F described above on a substrate having stopped at the work position. Because the mounters U1 and U2 both use these mechanisms with a common structure, these mechanisms in the mounter U1 are only explained as an example.

On the base table 11, a pair of support legs 41 are provided. The support legs 41 are positioned on opposite sides of the work position, and extend straightly in the Y direction (in the vertical direction shown in FIG. 2).

The support legs 41 are provided with respective guide rails 42 extending in the Y direction on the upper surface of the support legs 41. To the support legs 41, a head support body 51 is attached with its longitudinally opposite ends fitted to these left-side and right-side guide rails 42.

A Y-axis ball screw 45 extending in the Y direction is attached to the support leg 41 on the right side. Further, a ball nut (not shown) is screwed onto the Y-axis ball screw 45. A Y-axis motor 47 is additionally provided on the Y-axis ball screw 45.

When the Y-axis motor 47 is energized and operated, the ball nut moves back and forth along the Y-axis ball screw 45. Consequently, the head support body 51 fixed to the ball nut, and therefore the head unit 60, to be described next, move in the Y direction along the guide rails 42 (a Y-axis servo mechanism).

The head unit 60 is attached to the head support body 51 through a guide member (not shown) such that the head unit 60 is movable in the X-axis direction.

An X-axis ball screw 55 extending in the X direction is attached to the head support body 51. Further, a ball nut is screwed onto the X-axis ball screw 55.

With this configuration, when an X-axis motor 57 is energized and operated, the ball nut moves back and forth along the X-axis ball screw 55. Consequently, the head unit 60 fixed to the ball nut moves in the X direction (an X-axis servo mechanism).

Therefore, the head unit 60 can be operated to move in a horizontal direction (the XY direction) on the base table 11 by controlling the X-axis servo mechanism and the Y-axis servo mechanism in combination.

In the head unit 60, suction heads (not shown) that perform mounting operation are installed in a line. The suction heads protrude downward from the bottom surface of the head unit 60, and are configured to move up and down relative to a frame of the head unit 60 by driving of a Z-axis motor (a Z-axis servo mechanism). The tip end of each suction head is provided with a suction nozzle 63, through which a negative-pressure means (not shown) supplies a negative pressure.

With the configuration as described above, each servo mechanism is actuated at a predetermined timing, and thereby the suction nozzle 63 can pick up a component supplied to the component supply position O through the feeder F. It is also possible to move the component picked up by the suction nozzle 63 to the component installation position on a substrate, and thereafter mount the component at the component installation position (the component mounting process).

FIG. 2 shows a component recognition camera denoted by a reference numeral 17. The component recognition camera 17 captures an image of a component picked up by the suction nozzle 63, and detects a posture of the sucked component.

Figure 5:
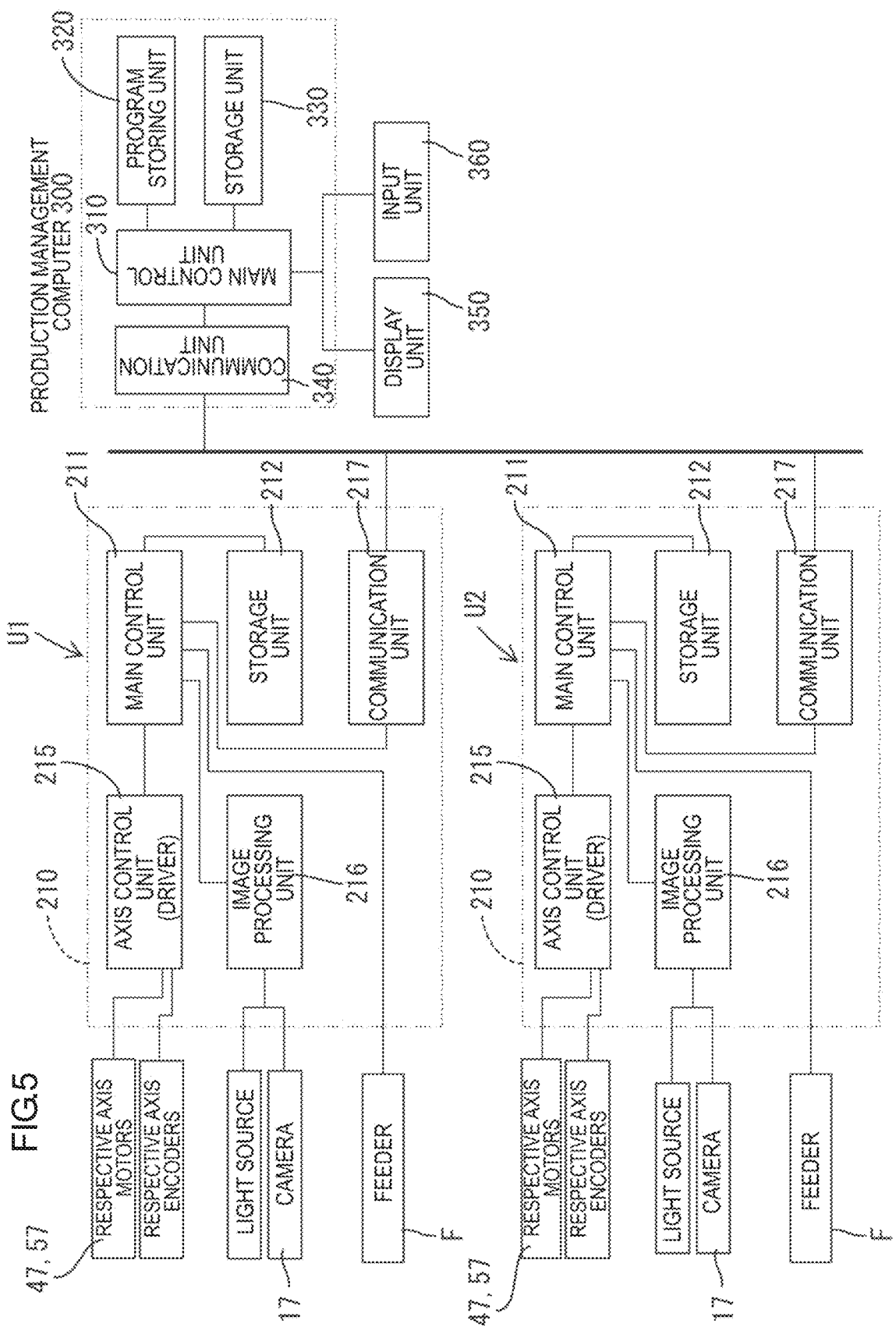
FIG. 5 is a block diagram showing an electrical configuration of the entire substrate production line.

3. Electrical Configuration of Each Device (a) Electrical Configuration of Surface Mounter As shown in FIG. 5, each of the mounters U1 and U2 is controlled in a centralized manner in its entirety by a controller 210. The controller 210 includes a main control unit 211 made up of a CPU and the like, as well as a storage unit 212, an axis control unit 215, an image processing unit 216, and a communication unit 217.

The axis control unit 215 is electrically connected to respective axis motors 47 and 57, and respective axis encoders that detect a rotational state of the respective axis motors 47 and 57, such that the respective axis motors 47 and 57 can be controlled through the axis control unit 215.

The image processing unit 216 is electrically connected to the component recognition camera 17 and a light source such that an image output from the component recognition camera 17 can be imported into the image processing unit 216.

With the configuration described above, the main control unit 211 actuates the respective axis motors 47 and 57 and other devices appropriately to thereby make it possible to perform the component supply process through the feeder F and the component mounting process using the head unit 60.

(b) Electrical Configuration of Production Management Computer

The production management computer 300 is made up principally of a main control unit 310, a program storing unit 320, a storage unit 330, a display unit 350, an input unit 360, and other units. The production management computer 300 is connected to the LAN through the communication unit 340.

The input unit 360 has a function of receiving an input of production information (information related to substrate production for target product types). In this example, the input unit 360 is made up of a touch panel.

The storage unit 330 has stored therein various types of data needed for controlling the devices, as well as data in which components B1 to B15 are associated in advance with their corresponding feeders F1 to F15 as shown in FIG. 6.

With this configuration, provided that the type (kind) of the components B1 to B15 to be mounted on a substrate can be identified, data of the type of the feeders F1 to F15 needed for supplying the identified type of component, and data of width dimensions W1 to W15 of the corresponding feeders F1 to F15 can be obtained.

When production information is input through the input unit 360, necessary data is read from the storage unit 330. The main control unit 310 reads necessary programs from the program storing unit 320 and executes the programs sequentially so as to automatically generate a production plan such as a production sequence of substrates.

A specific process flow to be executed by the production management computer 300 is described below with reference to a flowchart shown in FIG. 7.

The specific process flow is now described assuming that the following production information has been already input through the input unit 360.

(1) Product types of substrates to be consecutively produced (four product types including product types A to D)

(2) Information of components to be mounted on each product type of substrate

In the production management computer 300, when production information is input, the main control unit 310 performs a process of accessing the storage unit 330 and reading data of the feeders F to be used for production (S10).

When data of the feeders F is read, then a process of calculating an arrangement space for the feeders F, and therefore calculating the number of necessary carts N needed for arranging the feeders F is performed on each of the product types A to D (S20).

The process in S20 is described using a specific example. In a case where 12 types of components, the components B1 to B12, are mounted on a substrate of the product type A, a numerical value of the arrangement space for the feeders F for the product type A is calculated by summing the widths W1 to W12 of 12 types of the feeders F1 to F12 corresponding to the components B1 to B12.

$$WF = W1 + W2 + \ldots + W11 + W12 + \alpha$$

wherein "$\alpha$" an expected value corresponding to certain gaps, which are needed between the feeders in actual arrangement.

As shown in FIG. 3, the feeder plate 110 provided on each of the carts D1 to D8 has a predetermined transverse width Wo. Thus, the number of necessary carts N for the substrate of the product type A can be calculated by dividing the arrangement space WF for the feeders F by the transverse width Wo of the feeder plate 110.

The process is further described below assuming that, as a result of the calculation, the number of necessary carts N for the substrate of the product type A is "eight", the number of necessary carts N for the substrate of the product type B is "seven", the number of necessary carts N for the substrate of the product type C is "three", and the number of necessary carts N for the substrate of the product type D is "four", as shown in FIG. 8A.

Figure 7:
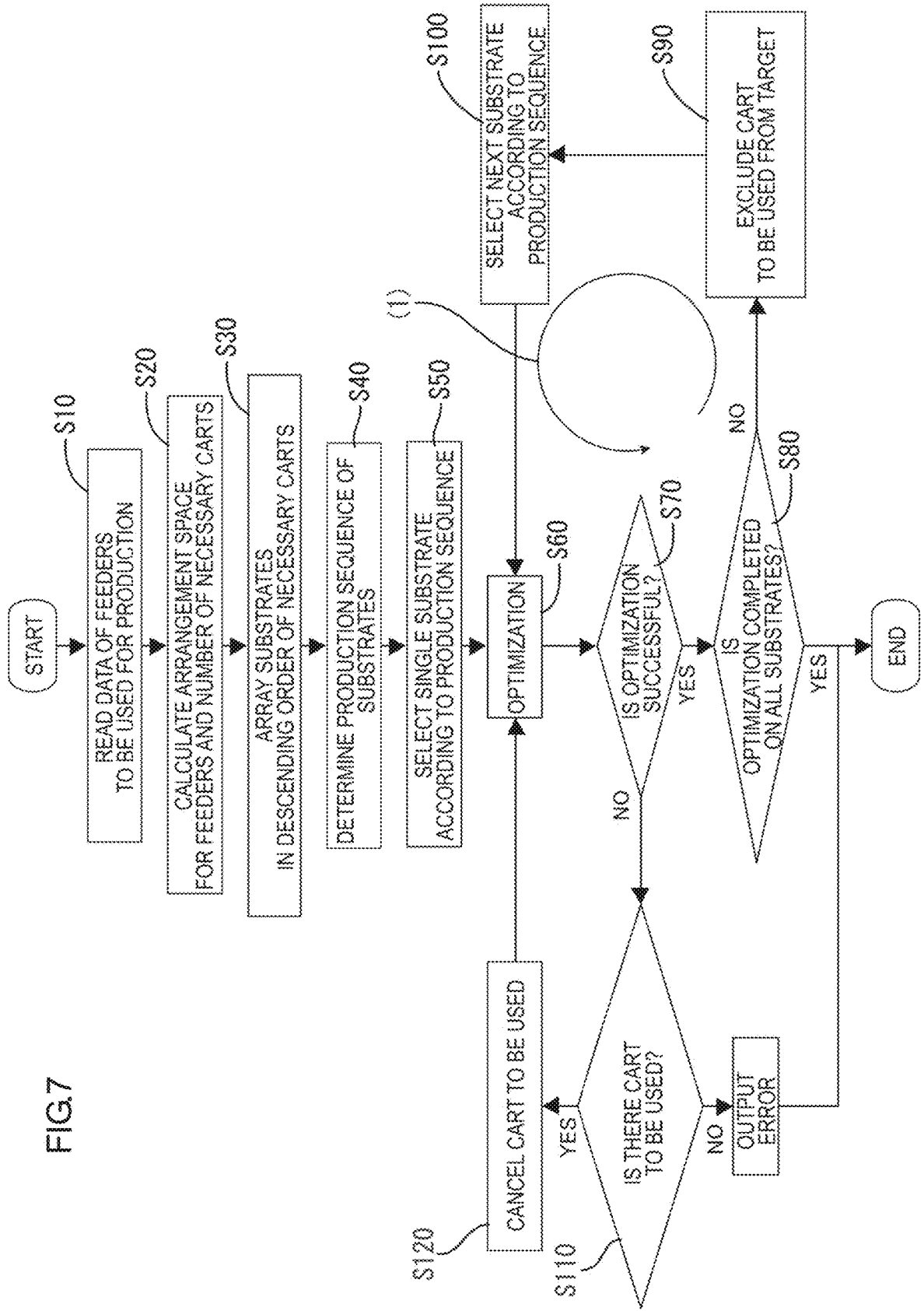
FIG. 7 is a flowchart showing a process flow to be executed by a production management computer.

As shown in FIG. 7, the number of necessary carts N is calculated in the manner as described above, and thereafter the main control unit 310 performs a process of rearranging the sequence of the substrates in descending order of the number of necessary carts N (S30).

In this process, the sequence of the substrates is rearranged in order described as the product type A, the product type B, the product type C, and the product type D as shown in FIG. 8B.

Off-line setup work is now described, in which the feeders F to be used for the next substrate production are attached to the feeder plate 110, and the feeder plate 110 is attached to the mounters U1 and U2 before completion of the ongoing substrate production. First, the off-line setup time and the machine operating time are defined. The off-line setup time refers to the time from start to completion of off-line setup of all the feeders F to be used for a single product type of substrate. The machine operating time refers to the time from start to completion of production of a single product type of substrate.

The off-line setup time may vary depending on workers' experiences, abilities, and the like. Thus, the off-line setup time may be stored in the storage unit 330 in association with each individual worker so as to read the off-line setup time on a worker-by-worker basis from the storage unit 330, or may be calculated by the main control unit 310 based on the number of necessary carts N as described later. In contrast, the machine operating time can be estimated from the types and total number of components to be used, and from the number of substrates scheduled to be produced. Accordingly, the machine operating time may be calculated by the main control unit 310.

As shown in FIG. 8A, in general, off-line setup for the product type A, whose production is scheduled to start first, is carried out on the previous day. Thus, off-line setup for the product type B is started simultaneously with the start of production of the product type A. However, the machine operating time for the product type A is 30 minutes, while the off-line setup time for the product type B is 50 minutes. This causes machine operation stop for 20 minutes from completion of the production of the product type A to start of the production of the product type B. In order to prevent this machine operation stop, the product type C or the product type D, whose off-line setup time is shorter than A, is selected. It is necessary to select the product type C or the product type D, whose off-line setup time is equal to or shorter than 30 minutes, as a substrate to be produced subsequently to the product type A.

When the product type D is selected, eight carts are needed for the product type A, and four carts are needed for the product type D at the same time. Thus, the total number of necessary carts is 12. In contrast, when the product type C is selected, eight carts are needed for the product type A, and three carts are needed for the product type C at the same time. Thus, the total number of necessary carts is 11. Therefore, in a case where the product types C and D require an equal off-line setup time, it is more advantageous to select the product type C with a smaller number of necessary carts.

This consequently leads to a production sequence shown in FIG. 8B, in which the product type C is selected as a substrate to be produced subsequently to the product type A, and thus the product type B and the product type C are interchanged. In this production sequence, the off-line setup time is, sequentially from A, the product type A: 30 minutes, the product type C: 10 minutes, the product type B: 50 minutes, and the product type D: 10 minutes. A substrate of a product type for which the off-line setup time is longer and a substrate of a product type for which the off-line setup time is shorter are alternately arrayed.

This results in the sum of the off-line setup times for the product types A and C being 40 minutes, the sum of the off-line setup times for the product types C and B being 60 minutes, and the sum of the off-line setup times for the product types B and D being 60 minutes. The sum of the off-line setup times for two product types of substrates to be consecutively produced is balanced over the entire period of consecutive production. Further, because the off-line setup time for the product type C is 10 minutes, the off-line setup for the product type C is completed before completion of the production of the product type A. This can prevent the machine operation stop, and additionally can start off-line setup for the product type B during the production of the product type A.

With respect to the product types of substrates shown in FIG. 8B, all machine operating times are set uniformly at 30 minutes regardless of the product types of substrates. In this case, the sum of the machine operating times for two product types of substrates to be consecutively produced becomes constant. Accordingly, the production sequence of substrates is determined such that a substrate of a product type for which the off-line setup time is longer and a substrate of a product type for which the off-line setup time is shorter are alternately arrayed. This facilitates balancing of the sum of the off-line setup times.

In general, the off-line setup time tends to be proportional to the number of necessary carts N. Thus, in the present embodiment, the production sequence of substrates is determined by alternately arraying a substrate of a product type with a larger number of necessary carts N and a substrate of a product type with a smaller number of necessary carts N. As described above, the main control unit 310 can calculate the number of necessary carts N, and accordingly the main control unit 310 can also determine the production sequence of substrates. In this manner, the main control unit 310 determines the production sequence of substrates such that a substrate of a product type with a larger number of necessary carts N and a substrate of a product type with a smaller number of necessary carts N are alternately arrayed (S40).

After having determined the production sequence of substrates, the main control unit 310 subsequently selects a single substrate according to the production sequence (S50), then determines assignment of the feeders F regarding which of the feeders F is arranged at which position of which of the carts D1 to D8 such that the component mounting process can be performed most efficiently, and further determines the component mounting sequence (an optimizing process in S60).

The optimizing process is completed on the substrate of the product type A, and then the main control unit 310 performs processes in S70 and S80. When the determination is YES in the process in S70, and when the determination is NO in the process in S80, then the process is consequently shifted to S90.

In S90, a process of excluding a cart, which has been assigned to the substrate having already undergone the optimizing process in S60, from the target for the optimizing process is performed. Thereafter, the process is shifted to S100. In S100, the main control unit 310 performs a process of selecting the next substrate according to the production sequence. With this process, a substrate of the product type C is selected in this example. When the optimizing process is completed on the substrates of all the product types A, C, B, and D, the determination is YES in S80, and a series of the processes is ended.

Thereafter, under control of the production management computer 300, the respective devices, making up the substrate production line L, that is, the solder printing device, the surface mounters U1 and U2, and the reflow device R, are operated such that production of a substrate of the product type A proceeds.

During production of the substrate of the product type A, the feeders F, to be used for the product type C scheduled to be produced subsequently to the product type A, can be set up on carts simultaneously in parallel to the production of the substrate of the product type A. The carts, on which set-up of the feeders F has completed, are attached to the component supply units 30 of the surface mounters U1 and U2, and then the substrate of the product type C can be produced consecutively after completion of the production of the substrate of the product type A without a pause. In other words, replacement work for exchanging carts is performed without the need for a halt of the substrate production line L.

Further, the feeders F, to be used for the product type B scheduled to be produced subsequently, can be set up on carts simultaneously in parallel to the production of the substrate of the product type A.

As described above, according to the present embodiment, the sum of the off-line setup times for two product types of substrates to be consecutively produced is balanced over the entire period of consecutive production. This can prevent machine operation stop caused by a wait for the off-line setup work.

The determination means may determine a production sequence of substrates such that, when a time from start to completion of production of a single product type of substrate is defined as a machine operating time, and when the machine operating time is constant for two product types of substrates to be consecutively produced, a substrate of a product type for which the off-line setup time is longer and a substrate of a product type for which the off-line setup time is shorter are alternately arrayed.

According to this configuration, in a case where the machine operating time is constant, while the off-line setup time is different between two product types of substrates to be consecutively produced, the sum of the off-line setup times can be balanced by alternately arraying these two product types of substrates.

The component supply devices may be arranged side by side on a single attachment plate (the feeder plate 110), and it may be possible to attach the attachment plates to the surface mounter. The determination means may determine a production sequence of substrates such that a substrate of a product type with a larger number of the attachment plates needed simultaneously, and a substrate of a product type with a smaller number of the attachment plates needed simultaneously are alternately arrayed.

In order to carry out off-line setup, at least a total number of attachment plates to be used for two product types of substrates to be consecutively produced are needed. According to the configuration described above, a substrate of a product type with a larger number of necessary attachment plates and a substrate of a product type with a smaller number of necessary attachment plates are alternately arrayed. This can minimize the number of attachment plates to be used simultaneously.

In a case where the off-line setup time for each substrate is approximately proportional to the number of attachment plates used, the sum of the off-line setup times for two product types of substrates to be consecutively produced can also be balanced.

Other Embodiments

The technique disclosed in the present specification is not limited to the embodiment explained in the above descriptions with reference to the above drawings, but also includes various aspects for example as follows.

(1) In the above embodiment, the two connection-type line configuration, in which the two surface mounters U1 and U2 are connected in series, is illustrated as an example. However, the number of surface mounters connected is not limited to two, but may also be three or more. Furthermore, the above embodiment may also be applicable to a line configuration in which a single surface mounter is used.

(2) In the above embodiment, the production management computer 300 provided as a dedicated computer is illustrated as an example. However, for example, in a case where only a single surface mounter is used, the processing functions of the production management computer 300 according to the above embodiment are all incorporated into the surface mounter, which makes it possible to eliminate the production management computer 300 itself.

(3) In the above embodiment, the production sequence of substrates is determined such that a substrate of a product type with a larger number of necessary carts N and a substrate of a product type with a smaller number of necessary carts N are alternately arrayed. As a result of this, a substrate of a product type for which the off-line setup time is longer and a substrate of a product type for which the off-line setup time is shorter are alternately arrayed. However, the production sequence of substrates may also be determined by only the off-line setup time read from the storage unit 330 regardless of the number of necessary carts N.

What is claimed is:

1. A production management device that determines a production sequence of plural types of substrates in order to produce the substrates consecutively on a product type-by-type basis by using a component mounter including a plurality of component supply devices, the production management device comprising a controller configured to determine a production sequence of substrates such that, where a time from start to completion of off-line setup of all the component supply devices to be used for a single product type of substrate is defined as an off-line setup time, a sum of the off-line setup times for two product types of substrates to be consecutively produced is balanced over an entire period of consecutive production, wherein the plurality of the component supply devices are arranged side by side on a single attachment plate, and it is possible to attach a plurality of the attachment plates to the component mounter, and the controller is configured to determine the production sequence of substrates such that a substrate of a product type with a larger number of the attachment plates needed simultaneously, and a substrate of a product type with a smaller number of the attachment plates needed simultaneously are alternately arrayed.

2. A production management device that determines a production sequence of plural types of substrates in order to produce the substrates consecutively on a product type-by-type basis by using a component mounter including a plurality of component supply devices, the production management device comprising a controller configured to determine a production sequence of substrates such that, where a time from start to completion of off-line setup of all the component supply devices to be used for a single product type of substrate is defined as an off-line setup time, a sum of the off-line setup times for two product types of substrates to be consecutively produced is balanced over an entire period of consecutive production, wherein the controller is configured to determine the production sequence of substrates such that, when a time from start to completion of production of a single product type of substrate is defined as a machine operating time, and when the machine operating time is constant for two product types of substrates to be consecutively produced, a substrate of a product type for which the off-line setup time is longer and a substrate of a product type for which the off-line setup time is shorter are alternately arrayed, the plurality of the component supply devices are arranged side by side on a single attachment plate, and it is possible to attach a plurality of the attachment plates to the component mounter, and the controller is configured to determine the production sequence of substrates such that a substrate of a product type with a larger number of the attachment plates needed simultaneously, and a substrate of a product type with a smaller number of the attachment plates needed simultaneously are alternately arrayed.

3. A production management device that determines a production sequence of a plurality of different product type substrates in order to produce the substrates consecutively on a product type-by-type basis by using a component mounter including a plurality of component supply devices, the production management device comprising a controller configured to rearrange a consecutive production sequence for producing the plurality of different product type substrates by comparing respective off-line setup times for each of the product type substrates and respective machine operating times for each of the product type substrates, to determine a start time for each respective off-line setup and minimize a downtime across a sum of the machine operating times, wherein the respective off-line setup time for each of the product type substrates is defined as a time from start to completion of off-line setup of all the component supply devices to be used for the respective product type substrate.

* * * * *